United States Patent
Hano

(10) Patent No.: US 12,279,393 B2
(45) Date of Patent: Apr. 15, 2025

(54) SUBSTRATE UNIT AND ELECTRIC POWER CONVERSION APPARATUS

(71) Applicant: TMEIC Corporation, Chuo-ku (JP)

(72) Inventor: Mitsuru Hano, Tokyo (JP)

(73) Assignee: TMEIC Corporation, Chuo-ku (JP)

( * ) Notice: Subject to any disclaimer, the term of this patent is extended or adjusted under 35 U.S.C. 154(b) by 257 days.

(21) Appl. No.: 17/998,377

(22) PCT Filed: Apr. 5, 2021

(86) PCT No.: PCT/JP2021/014485
§ 371 (c)(1),
(2) Date: Nov. 10, 2022

(87) PCT Pub. No.: WO2022/215113
PCT Pub. Date: Oct. 13, 2022

(65) Prior Publication Data
US 2023/0156949 A1    May 18, 2023

(51) Int. Cl.
*H05K 9/00* (2006.01)
*H05K 7/02* (2006.01)

(52) U.S. Cl.
CPC ............. *H05K 7/02* (2013.01); *H05K 9/0075* (2013.01); *H05K 9/0081* (2013.01)

(58) Field of Classification Search
CPC ....... H05K 7/02; H05K 9/0075; H05K 9/0081
USPC ........................................................ 361/818
See application file for complete search history.

(56) References Cited

U.S. PATENT DOCUMENTS 4,299,518 A * 11/1981 Whelan .................. B65G 51/03
406/88

FOREIGN PATENT DOCUMENTS

| JP | 49-19259 U | 2/1974 |
| JP | 57-113489 U | 7/1982 |
| JP | 9-331174 A | 12/1997 |
| JP | 2017-135959 A | 8/2017 |
| JP | 2020-35936 A | 3/2020 |
| JP | 2020-195274 A | 12/2020 |

OTHER PUBLICATIONS

International Search Report mailed on Jun. 29, 2021 in PCT/JP2021/014485 filed on Apr. 5, 2021 (5 pages).
Written Notice of Reasons for Refusal mailed on Sep. 6, 2022, in JP Patent Application No. 2021-552555 (with English Translation therein, 12 pages).

* cited by examiner

*Primary Examiner* — Binh B Tran
(74) *Attorney, Agent, or Firm* — Oblon, McClelland, Maier & Neustadt, L.L.P.

(57) ABSTRACT

A substrate unit of an embodiment includes a plurality of substrates and a holding part. The plurality of substrates are arranged at a constant interval in a thickness direction. The holding part integrally holds the plurality of substrates and allows, relative to one substrate of the plurality of substrates, another substrate to be movable along a plane direction of the substrate.

11 Claims, 3 Drawing Sheets

SUBSTRATE UNIT AND ELECTRIC POWER CONVERSION APPARATUS

TECHNICAL FIELD

An embodiment of the present invention relates to a substrate unit and an electric power conversion apparatus.

BACKGROUND

A large number of electric components and substrates on which various elements are mounted are stored in a housing of an electric power conversion apparatus. Since there are space restrictions in the housing, a variety of techniques have been proposed for storing a large number of electric components and substrates.

For example, a technique is disclosed in which a plurality of inner surfaces of a housing are used and electric components are three-dimensionally arranged (for example, refer to Patent Document 1).

Further, a technique is disclosed in which a plurality of substrates are arranged over each other via a column portion in order to three-dimensionally arrange the substrates (for example, refer to Patent Document 2).

However, when the electric components are three-dimensionally arranged or a plurality of substrates are simply arranged over each other as described above, a portion that is difficult to reach when a door of the housing is opened occurs. Therefore, there is a possibility that maintenance and access performances for connecting a terminal or the like to the electric component and the substrate may deteriorate.

RELATED ART DOCUMENTS

Patent Documents

[Patent Document 1]
Japanese Unexamined Patent Application, First Publication No. 2017-135959
[Patent Document 2]
Japanese Unexamined Patent Application, First Publication No. 2020-195274

SUMMARY OF INVENTION

Problems to be Solved by the Invention

A problem to be solved by the present invention is to provide a substrate unit and an electric power conversion apparatus that are capable of arranging a plurality of substrates in a small space and have excellent access and maintenance performances.

Means for Solving the Problem

A substrate unit of an embodiment includes a plurality of substrates and a holding part. The plurality of substrates are arranged at a constant interval in a thickness direction. The holding part integrally holds the plurality of substrates and allows, relative to one substrate of the plurality of substrates, another substrate to be movable along a plane direction of the substrate.

DESCRIPTION OF THE EMBODIMENTS

Hereinafter, a substrate unit and an electric power conversion apparatus according to an embodiment will be described with reference to the drawings.

Figure 1:
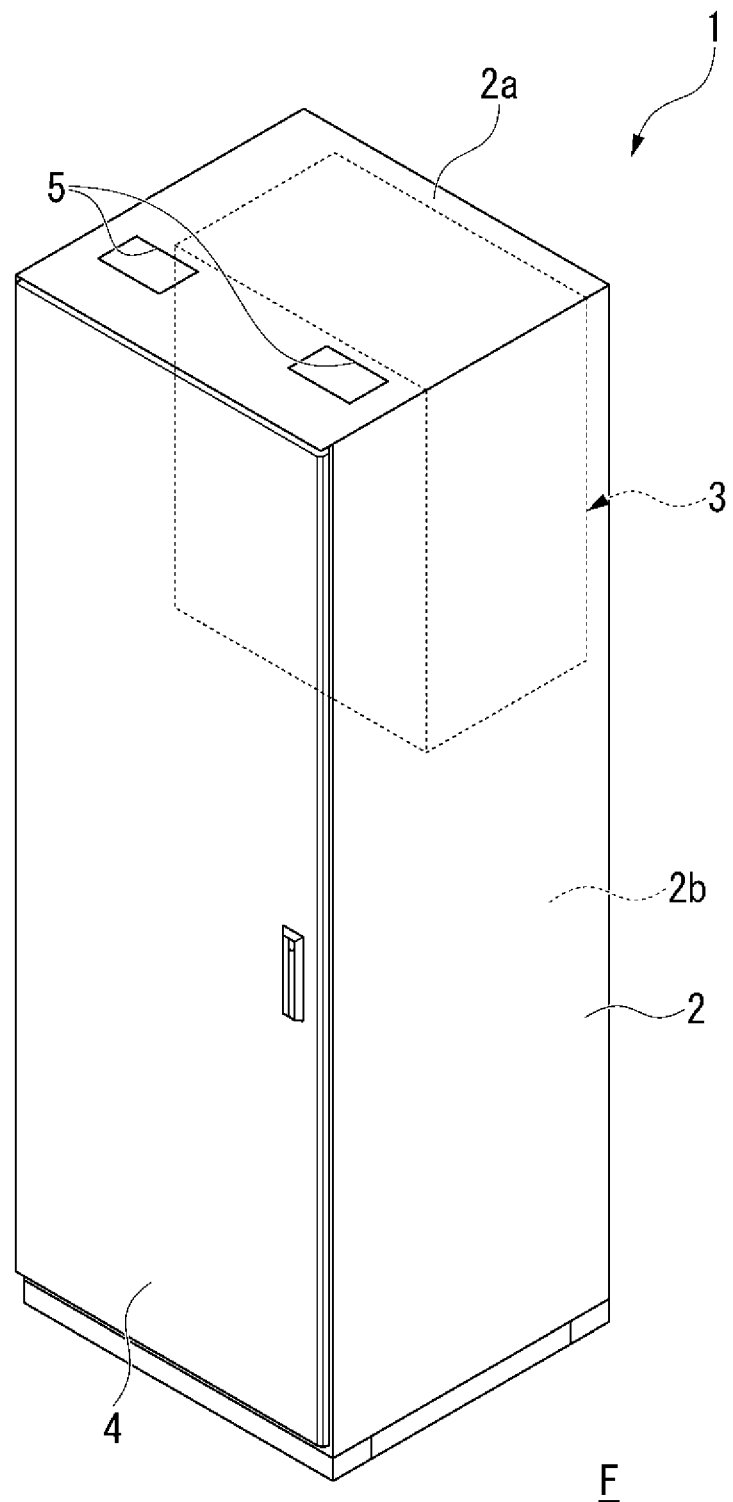
FIG. 1 is a perspective view showing an electric power conversion apparatus according to an embodiment.

FIG. 1 is a perspective view showing an electric power conversion apparatus 1.

As shown in FIG. 1, the electric power conversion apparatus 1 includes a housing 2 and a substrate unit 3 provided in the housing 2. Hereinafter, a vertical direction and a horizontal direction in a state where the housing 2 is installed on an installation surface F will be described by simply referring to the vertical direction and the horizontal direction.

The housing 2 is formed in a box shape and has a front surface on which a door 4 is provided. A retraction port 5 for retracting an electric wire that extends from the outside (not shown) into the housing 2 is formed on a top plate 2a of the housing 2.

The substrate unit 3 is attached to an inside surface of a rear surface 2b of the housing 2. The substrate unit 3 is arranged at an upper portion of the housing 2 close to the retraction port 5.

Figure 2:
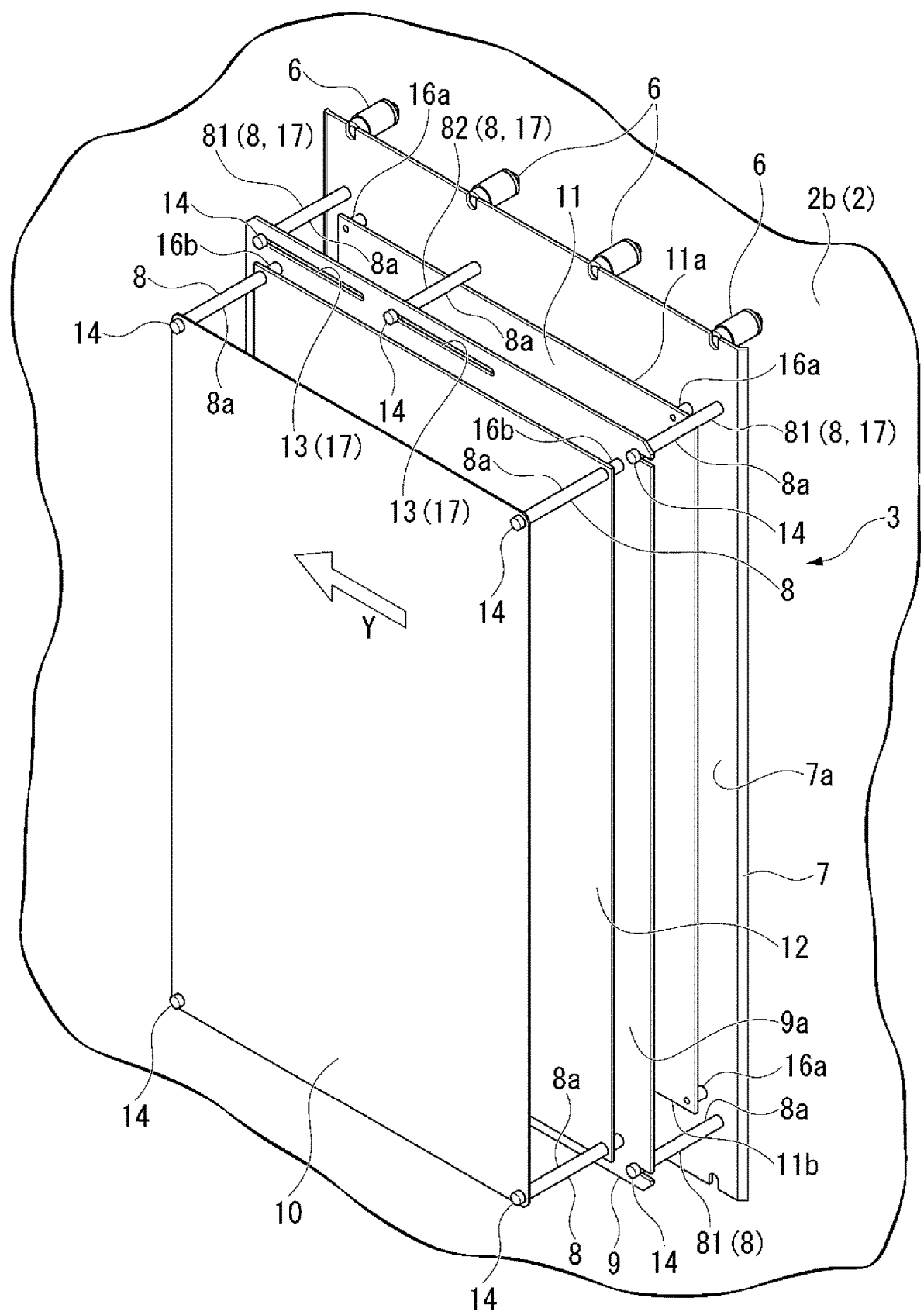
FIG. 2 is a perspective view showing a substrate unit according to the embodiment.

FIG. 2 is a perspective view of the substrate unit 3.

As shown in FIG. 2, the substrate unit 3 mainly includes a first base plate 7 that is fixed to the rear surface 2b of the housing 2 via a plurality of insulators 6, a second base plate 9 that is fixed to one surface 7a of the first base plate 7 on an opposite side of the insulator 6 via an intermediate support part 8, a third base plate 10 that is fixed to one surface 9a of the second base plate 9 on an opposite side of the first base plate 7 via the intermediate support part 8, and a first substrate 11 and a second substrate 12 that are disposed on the first base plate 7 and the second base plate 9, respectively.

The base plates 7, 9, and 10 and the substrates 11 and 12 are arranged to face one another in a thickness direction such that a plane direction is along the vertical direction. The base plates 7, 9, and 10 and the substrates 11 and 12 are formed in a rectangular shape that is elongated in the vertical direction when seen from the thickness direction.

The substrates 11 and 12 are circuit substrates that constitute the electric power conversion apparatus, and a variety of electric elements are mounted thereon. In the following description, surface areas of the substrates 11 and 12 are substantially equal to each other when seen from the thickness direction of the substrates 11 and 12.

A surface area of the third base plate 10 is substantially equal to the surface areas of the substrates 11 and 12 when seen from the thickness direction of the base plates 7, 9, and 10 and the substrates 11 and 12. The surface area of the second base plate 9 is larger than the surface areas of the substrates 11 and 12. The surface area of the first base plate 7 is larger than the surface area of the second base plate 9.

The first substrate 11 is fixed via a first spacer 16a to the one surface 7a of the first base plate 7 formed in such a size. The first spacer 16a is provided at four corners of the first substrate 11. It is desirable that the first spacer 16a have an electric insulation property. However, the first spacer 16a may not have an electric insulation property.

A plurality (for example, six in the present embodiment) of intermediate support parts 8 are disposed on the one surface 7a of the first base plate 7 and around the first substrate 11. The intermediate support part 8 disposed on the first base plate 7 is constituted of a first intermediate support portion 81 disposed at positions corresponding to the four corners of the first substrate 11 and a second intermediate support portion 82 disposed at center positions in the horizontal direction of an upper side 11a and a lower side 11b of the first substrate 11.

The intermediate support part 8 is formed of a resin having an electric insulation property. The intermediate support part 8 is integrally formed of a spacer portion 8a having a polygonal columnar shape, a male screw portion (not shown) formed at one end of the spacer portion 8a in an axis direction, and a female screw portion (not shown) formed at the other end of the spacer portion 8a in the axis direction. The male screw portion of the intermediate support part 8 is fastened to the first base plate 7. The second base plate 9 is mounted on the female screw portion side of the intermediate support part 8.

A long hole 13 and a notch portion 15 are formed on the second base plate 9 at an outer circumferential part corresponding to the intermediate support part 8. More specifically, a long hole 13 having an ellipse shape elongated in the horizontal direction is formed on the second base plate 9 at positions corresponding to two second intermediate support portions 82 and two first intermediate support portions 81 arranged on one side in the horizontal direction of the intermediate support part 8. Further, the notch portion 15 is formed on the second base plate 9 at positions corresponding to two first intermediate support portions 81 arranged on the other side in the horizontal direction of the intermediate support part 8.

A fixation screw 14 is fastened to the female screw portion of the intermediate support part 8 via the long hole 13 and the notch portion 15 from the one surface 9a side of the second base plate 9. Thereby, the second base plate 9 is fastened and fixed to the intermediate support part 8 by the fixation screw 14.

Here, the long hole 13 is formed so as to allow sliding movement in one direction (in the present embodiment, to the left side of the paper surface of FIG. 2, refer to an arrow Y) in the horizontal direction of the second base plate 9 relative to the intermediate support part 8 in a state where the fixation screw 14 is loosened.

The notch portion 15 is formed so as to allow sliding movement in one direction (refer to the arrow Y of FIG. 2) in the horizontal direction of the second base plate 9 relative to the intermediate support part 8 in a state where the fixation screw 14 is loosened. That is, the notch portion 15 is formed such that one side of the second base plate 9 opens.

Here, the size of the substrate unit 3 is a size in which the second base plate 9 is capable of performing sliding movement within the housing 2.

The second substrate 12 is fixed via a second spacer 16b to the one surface 9a of the second base plate 9 at a large portion of the middle so as to avoid the long hole 13 and the notch portion 15. The second spacer 16b is provided at four corners of the second substrate 12. It is desirable that the second spacer 16b have an electric insulation property. However, the second spacer 16b may not have an electric insulation property.

The intermediate support part 8 is disposed on a surface on the opposite side of the second base plate 9 at the four corners of the second substrate 12. The third base plate 10 is mounted on an end of the intermediate support part 8 on an opposite side of the second substrate 12. The third base plate 10 is fastened and fixed to the intermediate support part 8 by the fixation screw 14.

Here, at least the second base plate 9 and the third base plate 10 among the base plates 7, 9, and 10 are shield plates formed of a magnetic plate such as iron. The shield plate blocks electric noise. The second base plate 9 or the third base plate 10 itself may not be a shield plate. The second base plate 9 or the third base plate 10 may be a shield plate by applying a copper foil or the like to the second base plate 9 or the third base plate 10.

Next, the action of the substrate unit 3 is described.

First, the arrangement position of the substrate unit 3 is described. The substrate unit 3 is disposed at an upper portion close to the retraction port 5 of the housing 2. Therefore, by assembling, to the substrate unit 3, a connection terminal with an electric wire that extends from an external device to the substrate unit 3, the length of the electric wire retracted to the housing 2 through the retraction port 5 can be shortened as much as possible.

Here, when the door 4 (refer to FIG. 1) of the housing 2 is opened to perform maintenance or access the substrate unit 3 for connecting the terminal or the like to the substrate unit 3, the third base plate 10 and the second base plate 9 are present on a front surface. Therefore, it is difficult for a worker to reach the first substrate 11 disposed at the back of the second base plate 9 and the third base plate 10. Therefore, in the substrate unit 3, the following operation is possible.

Figure 3:
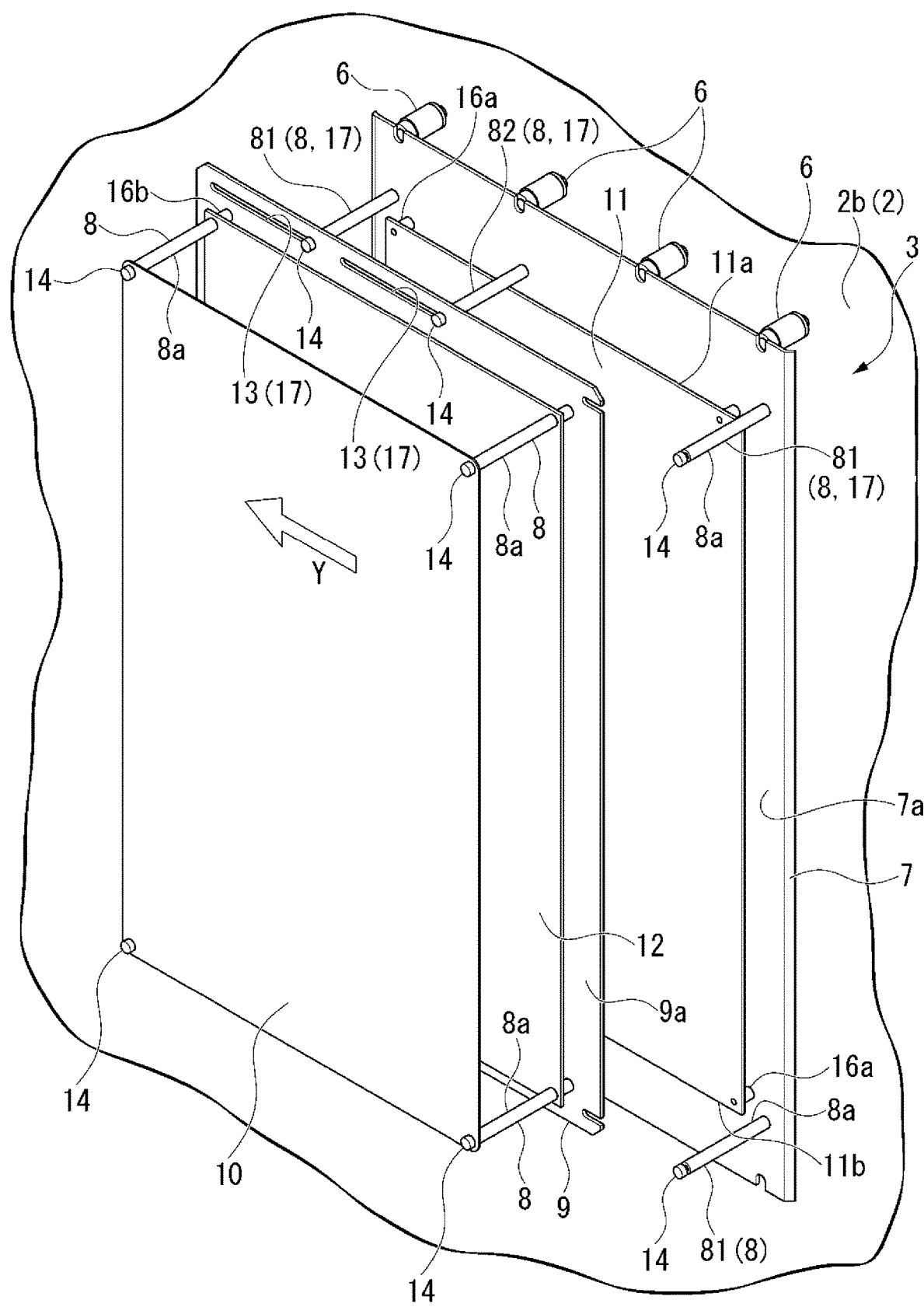
FIG. 3 is an action description view showing the substrate unit according to the embodiment.

FIG. 3 is an action description view of the substrate unit 3.

That is, as shown in FIG. 2 and FIG. 3, when accessing the first substrate 11 or performing maintenance, first, the fixation screw 14 to which the second base plate 9 is fastened and fixed is loosened. The long hole 13 and the notch portion 15 are formed in the second base plate 9. Therefore, by loosening the fixation screw 14, it is possible to perform sliding movement of the second base plate 9, the second substrate 12, and the third base plate 10 in the horizontal direction relative to the first substrate 11 (the first base plate 7) (refer to arrows Y of FIG. 2 and FIG. 3).

Then, the first substrate 11 is exposed to the front surface. Accordingly, it is possible to easily access the first substrate 11 or perform maintenance.

In this way, the first base plate 7, the second base plate 9, the intermediate support part 8, the long hole 13, and the notch portion 15 have a role as a holding part 17 that integrally holds the first substrate 11 and the second substrate 12 and allows the sliding movement of the second substrate 12 relative to the first substrate 11.

Here, for example, in order to promote heat dissipation in the housing 2, an air-blowing fan (not shown) may be provided on the top plate 2a of the housing or the like. In such a case, cooling air that flows along the vertical direction or the horizontal direction occurs in the housing 2. The base plates 7, 9, and 10 and the substrates 11 and 12 that constitute the substrate unit 3 are arranged to face one another in the thickness direction such that the plane direction is along the vertical direction. Therefore, the base plates 7, 9, and 10 and the substrates 11 and 12 are disposed along the flow of the cooling air, and thereby, the flow of the cooling air is not blocked by the base plates 7, 9, and 10 and the substrates 11 and 12.

In this way, the substrate unit 3 described above includes: the substrates 11 and 12 (the first substrate 11, the second substrate 12) arranged at a constant interval in the thickness direction; and the holding part 17 that integrally holds the first substrate 11 and the second substrate 12 and allows the sliding movement of the second substrate 12 relative to the first substrate 11. Therefore, it is possible to arrange a plurality of substrates 11 and 12 in a small space, and it is possible to improve an access performance and a maintenance performance.

The holding part 17 is constituted of the first base plate 7, the second base plate 9, the intermediate support part 8, the long hole 13, and the notch portion 15. Therefore, it is not necessary to form the long hole 13 and the notch portion 15 directly on the substrates 11 and 12 while making the holding part 17 a simple structure. Accordingly, it is possible to prevent the strength of the substrates 11 and 12 from being degraded and prevent the substrates 11 and 12 from being damaged.

The intermediate support part 8 is formed of a resin having an electric insulation property. Therefore, the electric connection between the first base plate 7 and the second base plate 9 can be cut off through the intermediate support part 8. Accordingly, since the potential between the first base plate 7 and the second base plate 9 can be changed, the degree of design freedom of the first substrate 11 disposed on the first base plate 7 and the second substrate 12 disposed on the second base plate 9 can be enhanced. That is, it is possible to enhance the degree of arrangement freedom of electronic components mounted on the substrates 11 and 12.

At least the second base plate 9 and the third base plate 10 among the base plates 7, 9, and 10 are shield plates formed of a magnetic plate such as iron. Therefore, it is possible to prevent the effect of electric noise on the substrates 11 and 12, and it is possible to provide a substrate unit 3 having high reliability.

The base plates 7, 9, and 10 and the substrates 11 and 12 that constitute the substrate unit 3 are arranged to face one another in the thickness direction such that the plane direction is along the vertical direction. Therefore, cooling air or the like can smoothly flow between the base plates 7, 9, and 10 and the substrates 11 and 12, and it is possible to promote heat dissipation to the substrates 11 and 12.

The substrate unit 3 is disposed at the upper portion close to the retraction port 5 of the housing 2. Therefore, by assembling, to the substrate unit 3, the connection terminal with the electric wire that extends from the external device to the substrate unit 3, the length of the electric wire retracted to the housing 2 through the retraction port 5 can be shortened as much as possible. It is also possible to easily perform retraction of the electric wire.

The above embodiment is described using a case in which the retraction port 5 is formed on the top plate 2a of the housing 2. However, the embodiment is not limited thereto; and it is possible to arbitrarily determine the formation position of the retraction port 5. In this case, the arrangement position of the substrate unit 3 can be changed in accordance with the position of the retraction port 5. Thereby, the length of the electric wire retracted to the housing 2 can be shortened as much as possible, and it is also possible to easily perform retraction of the electric wire.

The above embodiment is described using a case in which the substrate unit 3 has three base substrates 7, 9, and 10 and two substrates 11 and 12. However, the embodiment is not limited thereto; and the number of the base plates 7, 9, and 10 may be three or more, and the number of substrates 11 and 12 may be two or more. The substrates 11 and 12 may be arranged at a constant interval in the thickness direction.

A case is described in which the substrates 11 and 12 are fixed to corresponding base plates 7 and 9. However, the embodiment is not limited thereto. The base plates 7 and 9 may not be provided, and the substrates 11 and 12 may be fixed directly to each other via the intermediate support part 8. In this case, for example, the long hole 13 or the notch portion 15 may be formed in the second substrate 12.

A case is described in which the holding part 17 is constituted of the first base plate 7, the second base plate 9, the intermediate support part 8, the long hole 13, and the notch portion 15. However, the embodiment is not limited thereto. The holding part 17 may integrally hold the first substrate 11 and the second substrate 12, and the second substrate 12 may be slidable relative to the first substrate 11.

For example, the first substrate 11 and the second substrate 12 may be connected together via a rail (not shown) instead of the long hole 13, and the second substrate 12 may be slidable relative to the first substrate 11. Further, for example, a rail may be provided on the substrates 11 and 12, and the rails may be integrated by another member.

A case is described in which the intermediate support part 8 is formed of a resin having an electric insulation property. However, the embodiment is not limited thereto. The intermediate support part 8 may not have an electric insulation property. Even in a case in which the intermediate support part 8 has an electric insulation property, the intermediate support part 8 may be formed of a material other than a resin.

According to at least one embodiment described above, since the holding part 17 that integrally holds the first substrate 11 and the second substrate 12 and allows the sliding movement of the second substrate 12 relative to the first substrate 11 is provided, it is possible to arrange a plurality of substrates 11 and 12 in a small space. Further, it is possible to improve an access performance and a maintenance performance to the substrate unit 3.

Since the holding part 17 is constituted of the first base plate 7, the second base plate 9, the intermediate support part 8, the long hole 13, and the notch portion 15, it is possible to make the holding part 17 a simple structure. Since it is not necessary to form the long hole 13 and the notch portion 15 directly on the substrates 11 and 12, it is possible to prevent the strength of the substrates 11 and 12 from being degraded. It is also possible to prevent the substrates 11 and 12 from being damaged.

Since the intermediate support part 8 is formed of a resin having an electric insulation property, the electric connection between the first base plate 7 and the second base plate 9 can be cut off through the intermediate support part 8. Therefore, since the potential between the first base plate 7 and the second base plate 9 can be changed, the degree of design freedom of the first substrate 11 disposed on the first base plate 7 and the second substrate 12 disposed on the second base plate 9 can be enhanced. That is, it is possible to enhance the degree of arrangement freedom of electronic components mounted on the substrates 11 and 12.

Since at least the second base plate 9 and the third base plate 10 among the base plates 7, 9, and 10 are shield plates formed of a magnetic plate such as iron, it is possible to prevent the effect of electric noise on the substrates 11 and 12, and it is possible to provide a substrate unit 3 having high reliability.

The base plates 7, 9, and 10 and the substrates 11 and 12 that constitute the substrate unit 3 are arranged to face one another in the thickness direction such that the plane direction is along the vertical direction. Therefore, cooling air or the like can smoothly flow between the base plates 7, 9, and 10 and the substrates 11 and 12, and it is possible to promote heat dissipation to the substrates 11 and 12.

The substrate unit 3 is disposed at the upper portion close to the retraction port 5 of the housing 2. Therefore, by assembling, to the substrate unit 3, the connection terminal with the electric wire that extends from the external device to the substrate unit 3, the length of the electric wire retracted to the housing 2 through the retraction port 5 can be shortened as much as possible. It is also possible to easily perform retraction of the electric wire.

Although some embodiments of the present invention have been described, these embodiments are presented as an example and do not limit the scope of the invention. These embodiments can be implemented in various other forms, and a variety of omissions, substitutions, and modifications can be made without departing from the scope of the invention. These embodiments and variations thereof are included in the scope and gist of the invention and are also included in the scope of the invention described in the appended claims and equivalence thereof.

DESCRIPTION OF THE REFERENCE SYMBOLS

1 Electric power conversion apparatus
2 Housing
3 Substrate unit
7 First base plate (base plate)
8 Intermediate support part
9 Second base plate (base plate)
11 First substrate (substrate)
12 Second substrate (substrate)
13 Long hole (hole)
17 Holding part
81 First intermediate support portion
82 Second intermediate support portion

The invention claimed is:

1. A substrate device, comprising:
a plurality of substrates that are arranged at a constant interval in a thickness direction; and
a holder that integrally holds the plurality of substrates and allows, relative to one substrate of the plurality of substrates, another substrate to be movable along a plane direction of the substrate,
wherein the holder further comprises:
a plurality of base plates that are arranged at a constant interval in a thickness direction,
an intermediate support that is provided between the base plates, and
an allowing part that is engaged with the intermediate support and allows movement in the plane direction relative to the intermediate support, and
wherein each of the substrates is arranged on each of the base plates.

2. The substrate device unit according to claim 1,
wherein the base plate that is arranged between the substrates is a shield plate.

3. An electric power conversion apparatus, comprising:
a housing; and
the substrate device according to claim 2 that is provided in the housing,
wherein the plurality of substrates are arranged such that a plane direction is along a vertical direction.

4. The substrate device according to claim 2,
wherein the allowing part is a hole that is formed on any one of the substrate and the base plate and has an ellipse shape elongated in one direction.

5. The substrate device according to claim 2,
wherein the intermediate support has an electric insulation property.

6. The substrate device according to claim 1,
wherein the allowing part is a hole that is formed on any one of the substrate and the base plate and has an ellipse shape elongated in one direction.

7. An electric power conversion apparatus, comprising:
a housing; and
the substrate device according to claim 6 that is provided in the housing,
wherein the plurality of substrates are arranged such that a plane direction is along a vertical direction.

8. The substrate device according to claim 6,
wherein the intermediate support has an electric insulation property.

9. The substrate device according to claim 1,
wherein the intermediate support has an electric insulation property.

10. An electric power conversion apparatus, comprising:
a housing; and
the substrate device according to claim 9 that is provided in the housing,
wherein the plurality of substrates are arranged such that a plane direction is along a vertical direction.

11. An electric power conversion apparatus, comprising:
a housing; and
the substrate device according to claim 1 that is provided in the housing,
wherein the plurality of substrates are arranged such that a plane direction is along a vertical direction.

* * * * *